(12) United States Patent
Walter

(10) Patent No.: US 10,859,815 B2
(45) Date of Patent: Dec. 8, 2020

(54) OPTICAL CORRECTION ARRANGEMENT, PROJECTION OBJECTIVE HAVING SUCH AN OPTICAL CORRECTION ARRANGEMENT AND MICROLITHOGRAPHIC APPARATUS HAVING SUCH A PROJECTION OBJECTIVE

(71) Applicant: Carl Zeiss SMT GmbH, Oberkochen (DE)

(72) Inventor: Holger Walter, Abtsgmuend (DE)

(73) Assignee: Carl Zeiss SMT GmbH

( * ) Notice: Subject to any disclaimer, the term of this patent is extended or adjusted under 35 U.S.C. 154(b) by 329 days.

(21) Appl. No.: 15/913,418

(22) Filed: Mar. 6, 2018

(65) Prior Publication Data
US 2018/0196256 A1    Jul. 12, 2018

Related U.S. Application Data

(63) Continuation of application No. PCT/EP2016/070981, filed on Sep. 6, 2016.

(30) Foreign Application Priority Data

Sep. 24, 2015 (DE) .................. 10 2015 218 329

(51) Int. Cl.
*G02B 27/00* (2006.01)
*G02B 26/08* (2006.01)
(Continued)

(52) U.S. Cl.
CPC ........... *G02B 26/0875* (2013.01); *G02B 3/04* (2013.01); *G02B 26/06* (2013.01);
(Continued)

(58) Field of Classification Search
None
See application file for complete search history.

(56) References Cited

U.S. PATENT DOCUMENTS

| 6,104,472 A | 8/2000 | Suzuki |
| 8,760,618 B2 | 6/2014 | Sumiyoshi |

(Continued)

FOREIGN PATENT DOCUMENTS

| CN | 103885176 A | 3/2014 |
| DE | 102013204572 | 9/2004 |

(Continued)

OTHER PUBLICATIONS

International Search Report for corresponding Appl No. PCT/EP2016/070981, dated Nov. 21, 2016.
(Continued)

*Primary Examiner* — Jennifer D. Carruth
(74) *Attorney, Agent, or Firm* — Fish & Richardson P.C.

(57) ABSTRACT

An optical correction arrangement includes a first and a second correction component arranged in succession along an optical axis. The first and the second correction components are provided with aspherical surface contours which at least approximately add up to zero overall in a zero position of the optical correction arrangement. The optical correction arrangement also includes a manipulator for displacing the first correction component in a first direction at a first speed and for displacing the second correction component in a second direction at a second speed. The first speed is greater than the second speed.

20 Claims, 6 Drawing Sheets

(51) Int. Cl.
    *G02B 26/06*     (2006.01)
    *G03F 7/20*     (2006.01)
    *G02B 3/04*     (2006.01)
    *G02B 3/00*     (2006.01)

(52) U.S. Cl.
    CPC ....... *G02B 27/0068* (2013.01); *G03F 7/7015* (2013.01); *G03F 7/70191* (2013.01); *G03F 7/70308* (2013.01); *G02B 3/0081* (2013.01)

(56) References Cited

U.S. PATENT DOCUMENTS

| | | |
|---|---|---|
| 9,678,440 B2 | 6/2017 | Juergens |
| 10,261,425 B2 | 4/2019 | Wolf et al. |
| 2001/0048512 A1 | 12/2001 | Suzuki et al. |
| 2009/0213352 A1 | 8/2009 | Goehnermeir |
| 2011/0292516 A1 | 12/2011 | Ojeda Castaneda et al. |
| 2013/0162964 A1 | 6/2013 | Thomas et al. |
| 2015/0015862 A1* | 1/2015 | Scholz ................ G03F 7/70191 355/67 |
| 2016/0054662 A1 | 2/2016 | Wolf et al. |

FOREIGN PATENT DOCUMENTS

| | | |
|---|---|---|
| DE | 69728126 T2 | 1/2005 |
| DE | 10 2007 046 419 A1 | 4/2008 |
| DE | 102008043321 | 7/2009 |
| DE | 10 2008 043 243 A1 | 10/2009 |
| DE | 102008043243 | 10/2009 |
| DE | 10 2013 204 572 A1 | 9/2014 |
| EP | 0 851 304 A2 | 7/1998 |
| JP | 10-142555 A | 5/1998 |
| JP | H10142555 A | 5/1998 |
| JP | 2003-107311 | 4/2003 |
| JP | 2003-178954 | 6/2003 |
| JP | 2004-327807 | 11/2004 |
| JP | 2010-166007 | 7/2010 |
| JP | 2010-187002 | 8/2010 |
| JP | 2013-135215 | 7/2013 |
| TW | 409304 B | 12/1986 |
| TW | 200839455 A | 10/2008 |
| TW | 201504769 A | 2/2015 |

OTHER PUBLICATIONS

Examination Report from related Chinese Application No. 201680055946.5, dated Mar. 16, 2020, with English translation.
Japanese Office Action, with translation thereof, for corresponding JP Appl No. 2018-515780, dated Jun. 29, 2020.

* cited by examiner

OPTICAL CORRECTION ARRANGEMENT, PROJECTION OBJECTIVE HAVING SUCH AN OPTICAL CORRECTION ARRANGEMENT AND MICROLITHOGRAPHIC APPARATUS HAVING SUCH A PROJECTION OBJECTIVE

CROSS-REFERENCE TO RELATED APPLICATIONS

The present application is a continuation of, and claims benefit under 35 USC 120 to, international application PCT/EP2016/070981, filed Sep. 6, 2016, which claims benefit under 35 USC 119 of German Application No. 10 2015 218 329.7, filed on Sep. 24, 2015. The entire disclosure of these applications are incorporated by reference herein.

FIELD

The disclosure relates to an optical correction arrangement including a first and a second correction component arranged in succession along an optical axis, the first and the second correction component being provided with aspherical surface contours which at least approximately add up to zero overall in a zero position of the optical correction arrangement, and a manipulator for displacing the first correction component in a first direction at a first speed and for displacing the second correction component in a second direction at a second speed. The disclosure further relates to a projection objective having such an optical correction arrangement and to a microlithographic apparatus for microlithography, in particular a projection exposure apparatus, having such a projection objective.

BACKGROUND

An optical correction arrangement is known from DE 10 2007 046 419 A1.

Such an optical correction arrangement is used in microlithography to change optical wavefronts of a projection objective, in particular for the correction thereof.

Microlithography, also known as photolithography or lithography, is one of the key technologies of semiconductor and microsystems technology for producing integrated circuits, semiconductor components and further electronic products. The basic concept of microlithography includes transferring predefined structures to a substrate via exposure processes. The predefined structures are attached to a reticle (also referred to as a "photomask") and typically contain microstructures and/or nanostructures. The substrate, for example a silicon wafer, is coated with a light-sensitive material. During the exposure, the exposure light, after passing through the projection objective, acts on the light-sensitive material such that the regions of the light-sensitive coating impinged by the exposure light are modified in terms of their chemical properties. In the regions of the coating treated thus, the light-sensitive material is subsequently removed using a solvent. Finally, etching is used to remove the substrate material from the regions of the substrate surface that are now exposed in order to transfer the predefined structures of the reticle onto the substrate surface.

Increasing the performance or the power density of the semiconductor components is considered desirable in current semiconductor technology. The miniaturization of the structure dimensions to increase the number of circuits integrable per unit area serves to this end. Under this aspect, ever higher desired properties are placed on the imaging properties of the projection objective. In particular, it is very important to reduce optical aberrations of microlithographic projection objectives to a very low level.

The optical aberrations can be both production-induced optical aberrations that are already intrinsically present after the production of the projection objective and optical aberrations that only occur during the operation of the projection objective. By way of example, optical elements of the projection objective may be impaired on account of the impingement with high-energy short-wavelength exposure light, in particular ultraviolet (UV), vacuum ultraviolet (VUV) and extreme ultraviolet (EUV) light, and the overheating accompanied thereby.

Further optical aberrations can be traced back to faulty surfaces such as surface roughness of the reticle and/or of the substrate, for example. In the process, there is a displacement of the object and image plane and of the focal position of the projection objective.

The prior art has disclosed correction arrangements for reducing optical aberrations of the projection objective. By way of example, the prior art set forth at the outset discloses a projection objective having an optical correction arrangement made of a plurality of optical correction elements. The correction elements are provided with aspherical surface contours which, in a zero position, add up to at least approximately zero overall. Moreover, at least one of the correction elements is displaceable relative to at least one of the remaining correction elements in the direction of the optical axis in order to set a desired corrective effect.

EP 0 851 304 A2 discloses a further correction arrangement having a plurality of displaceable plates, wherein the different plates are displaceable in two opposite horizontal directions perpendicular to the optical axis.

However, the aforementioned known correction arrangements have a substantial disadvantage, namely that they are unable to adequately correct optical aberrations occurring during the scanning process. During scanning, the exposure light impinges on the reticle, with the light beam striking on the reticle displacing along a horizontal direction perpendicular to the optical axis of the projection objective. So-called "overlay" errors may occur in the process, said overlay errors arising as consequential errors of telecentricity errors in conjunction with the change in the focal position during the scan, for example. Such optical aberrations may assume complicated field profiles which can only be described mathematically using higher-order Zernike coefficients. Such optical aberrations cannot be corrected, or can only be partly corrected, by the correction arrangements known from the prior art.

SUMMARY

The disclosure seeks to develop an optical correction arrangement of the type set forth at the outset to the effect of being able to more effectively correct optical aberrations occurring during the scanning process.

With respect to the optical correction arrangement specified at the outset, this can be achieved, according to the disclosure, by virtue of the first speed being greater than the second speed.

The first and the second correction component are provided with aspherical surface contours. Here, the respective aspherization may be provided on the inner side of the first or second correction component facing the interstice between the two correction components. Alternatively, or additionally, an outer side of the first and/or the second correction component, facing away from the interstice, may be provided with an aspherical surface contour.

The aspherical surface contours add at least approximately to zero in the zero position of the optical correction arrangement. Expressed differently, the optical effects of the aspherical surface contours compensate each other in the zero position of the correction arrangement such that, in the zero position, the exposure light passes through the optical correction arrangement at least approximately unmodified. The first and the second correction component are displaceable via the manipulator such that they can be displaced relative to one another. The manipulator is configured to displace the first correction component at a first speed and the second correction component at a second speed, with the first speed being greater than the second speed. Consequently, a desired corrective effect may be obtained in order to correct optical aberrations, in particular field-dependent aberrations.

In contrast to the correction arrangements known from the prior art, it is possible to particularly effectively correct optical aberrations occurring during the scanning process since the first speed and the second speed differ from one another.

By way of example, it is possible to correct optical aberrations such as overlay errors, which are connected to faulty surfaces or surface roughness of the reticle surface in the object plane and/or of the substrate surface in the image plane, with increased accuracy and reliability. The faulty surfaces are accompanied by a displacement of the object plane or of the image plane, and consequently of the focal position of the projection objective as well. As a result of this, there is a displacement of the focal position of the projection objective, varying quickly in time, during a scanning process for a semiconductor wafer.

In order to compensate this unwanted displacement of the focal position, the surfaces of the reticle and/or of the substrate may be measured prior to the scanning process. The measurement data may be supplied to the manipulator for controlling the correction components. During the scanning process, the manipulator displaces the first and/or the second correction component in order to bring about relative movement between the two correction components. As a result of it being possible to select the displacement speeds of the first and the second correction component to be different from one another, the produced relative movement can be advantageously matched to the measured surface profile of the reticle surface or the substrate surface.

In a preferred configuration, the first speed is greater than the second speed by at least one order of magnitude.

Consequently, the first and second correction component may be displaced at speeds that differ significantly from one another. In particular, the first correction component is displaceable in a significantly faster manner than the second correction component, for example displaceable in a faster manner by at least a factor of 10. A fast relative movement between the correction components, which is matched to the temporally fast-changing focal displacement of the projection objective, is achieved hereby. Consequently, a dynamic correction of optical aberrations such as overlay errors is advantageously brought about during the scanning process, for example during the exposure of a wafer or a semiconductor die. At the same time, optical aberrations that change comparatively slowly in time are effectively correctable by the displacement of the second correction component.

In a further preferred configuration, the manipulator is configured to displace the first correction component according to an oscillation movement along the first direction.

Using this measure, it is possible to particularly effectively correct optical aberrations that recur regularly in time during the exposure of a wafer including a plurality of dies. In the case of a faulty reticle surface, the displacement of the focal position is desirably compensated during the scanning process for each individual die. Therefore, a relative movement between the correction components that is matched to the focal displacement is desirably repeated correspondingly frequently in the case of a plurality of dies. Advantageously, this can be obtained in an ideal manner by the oscillation movement of the first correction component along the first direction, which preferably points parallel to the optical axis.

In a further preferred configuration, the oscillation movement is a periodic oscillation movement, the period of which is matched to an exposure duration for a semiconductor chip.

The exposure of a single die is typically effectuated in two steps: a first preparation step ("step") for adjusting the projection objective and a second scanning step ("scan") for scanning/exposing the die. Therefore, the exposure duration for a die emerges from the addition of the duration of both steps ("step and scan"). Consequently, the movement of the first correction component along the first direction produces a periodic compensation of the focal displacement of the projection objective. Consequently, overlay errors that recur regularly in time may be corrected with a particularly high accuracy.

In a further preferred configuration, the period of the oscillation movement is less than 100 ms, preferably less than 80 ms, further preferably less than 40 ms.

Consequently, an oscillation movement frequency arises, which is at least 10 Hz, preferably at least 12.5 Hz, further preferably at least 25 Hz. Advantageously, the oscillation movement of the first correction component can consequently be matched particularly effectively to a scanning rhythm of the projection objective that is typical for microlithography.

In a further preferred configuration, the first speed of the first correction component is variable within the period of the oscillation movement.

The faulty surface of the reticle and/or of the substrate may have an uneven profile, for example an irregularly wavy profile. In this case, it is particularly important to effectively compensate the likewise irregular focal displacement during the exposure of each individual die. This can be obtained by a speed of the first correction component that is variable over time within a period of the oscillation movement.

In a further preferred configuration, the first direction is parallel to the optical axis.

Using this measure, it is possible to particularly effectively correct the displacement of the focal position along the optical axis by way of displacing the first correction component. Here, an effective correction of overlay errors that change quickly over time is particularly advantageous.

In a further preferred configuration, the second direction is perpendicular to the optical axis.

In this way, it is possible to effectively correct additional optical aberrations which are caused for example, by the deformation of an optical element of the projection objective, for instance a mirror, lens or prism, and which change comparatively slowly over time.

In a further preferred configuration, the manipulator is configured to displace the first and the second correction component at the same time.

With the aid of this measure it is possible to bring about a relative movement between the first and the second correction component, in which the two correction components are displaced simultaneously at different speeds.

Advantageously, the corrective effects obtainable by the correction arrangement according to the disclosure are extended hereby.

In a further preferred configuration, the manipulator is arranged at least in part in an edge region of the first and/or the second correction component, wherein the edge region is formed outside of the aspherical surface contours.

Consequently, the manipulator is arranged at a distance from the optically effective faces of the correction arrangement set by the aspherical surface contours of the correction components. Advantageously, an impairment of the exposure process during the displacement of the first and/or the second correction component is precluded or at least reduced to a very low level.

In a further preferred configuration, the manipulator has a magnetic arrangement.

With the aid of the magnetic arrangement, a manipulator for displacing the correction components is achieved in a simple manner, said manipulator additionally facilitating a simple actuation. The magnetic arrangement may have a magnet, for example a permanent magnet and/or an electromagnet. Permanent magnets are advantageous as they are usable without an energy supply such as a current feed. Using electromagnets, it is possible to adjust an electromagnetic force action with a particularly high accuracy since the strength of the force action is variable by controlling the current fed into the coils of the electromagnet. The current can be varied with a high accuracy and a fast switching cycle. Therefore, the deflection of the first correction component along the first direction is variable at quick timescales and, at the same time, with an increased accuracy, which is only possible with difficulty using conventional mechanical displacement drives.

Preferably, the magnetic arrangement has at least one first magnet and at least one second magnet, wherein the at least one first magnet is arranged at the first correction component and the at least one second magnet is arranged at the second correction component.

As a result of this, at least one magnet is arranged in each case on both the first and the second correction component. Advantageously, the displacement of the two correction components is particularly effective as a result thereof, and so a desired optical corrective effect can be set particularly reliably. The at least one first magnet and the at least one second magnet may, moreover, be arranged with at least partial vertical overlap such that the magnetic fields of the first and of the second magnet can spatially overlap with one another. Advantageously, a force action between the at least one first magnet and the at least one second magnet is particularly effective, and so the corrective effect of the optical correction arrangement according to the disclosure is improved further.

In a further preferred configuration, the at least one first magnet is a permanent magnet and/or the at least one second magnet is an electromagnet.

Such a configuration is advantageous in that only the at least one second magnet has to be actuated in order to bring about a relative movement or displacement between the correction components. This is typically effectuated by applying an electric voltage to the coil of the electromagnet; this has the additional advantage that the force effect between the electromagnet and the permanent magnet is adjustable in a particularly accurate manner. Advantageously, the desired corrective effect is particularly precise thanks to the accurately adjustable relative position between the correction components.

In a further preferred configuration, the magnetic arrangement has a ring-shaped distribution.

This measure facilitates a magnetic force distribution in the region of the magnets distributed in a ring-shaped manner, with the force distribution being particularly uniform. This promotes a high force stability of the optical correction arrangement, both in its zero position and in a state in which the correction components are displaced relative to one another.

In a further preferred configuration, the manipulator interacts with a guide mechanism for guiding the first and/or the second correction component parallel and/or perpendicular to the optical axis.

This simplifies the displacement of the first and/or the second correction component, in each case in a predetermined direction. The guide mechanism may have a sliding-guide device.

In a further preferred configuration, the optical correction arrangement includes a third correction component.

This measure facilitates an optical correction arrangement having three correction components. As a result of this, further relative positions between the correction components are additionally adjustable, and so the corrective effect obtainable via the correction arrangement is advantageously extended. Here, the central correction component in the direction of the optical axis may be configured to be stationary relative to the optical axis. Alternatively, or additionally, at least one electromagnet may be attached to the central correction component.

In a further preferred configuration, the first, the second, and/or the third correction component is held via a spring device.

The spring device has at least one return spring, the spring force of which is superposed on the electromagnetic attraction or repulsion force of the magnetic arrangement. As a result of this, the magnetic arrangement can be held with increased force stability in its zero position or in a state in which the various correction components are displaced relative to one another. Further, the return force of the spring device may advantageously at least partly compensate the weight of the first and/or second correction component.

In a further preferred configuration, the manipulator has at least one actuator.

The at least one actuator serves to displace the first and/or the second correction component in at least one direction. By way of example, the at least one actuator may include an ultrasonic motor, a linear motor. Alternatively, or additionally, the at least one actuator may be based on electroactive polymers, plunger coils and/or pressure bellows.

A projection objective according to the disclosure for microlithographic applications has at least one optical correction arrangement according to one or more of the configurations described above. By way of example, the projection objective can be used, preferably integrated, in a microlithographic apparatus according to the disclosure, in particular a projection exposure apparatus.

Further advantages and features can be gathered from the following description and the attached drawing.

It goes without saying that the aforementioned features and those yet to be explained below can be used not only in the combination specified in each case but also in other combinations or on their own, without departing from the scope of the present disclosure.

BRIEF DESCRIPTION OF THE DRAWINGS

Exemplary embodiments of the disclosure are illustrated in the drawings and described hereinafter with reference to the drawings, in which.

DETAILED DESCRIPTION

Figure 1:
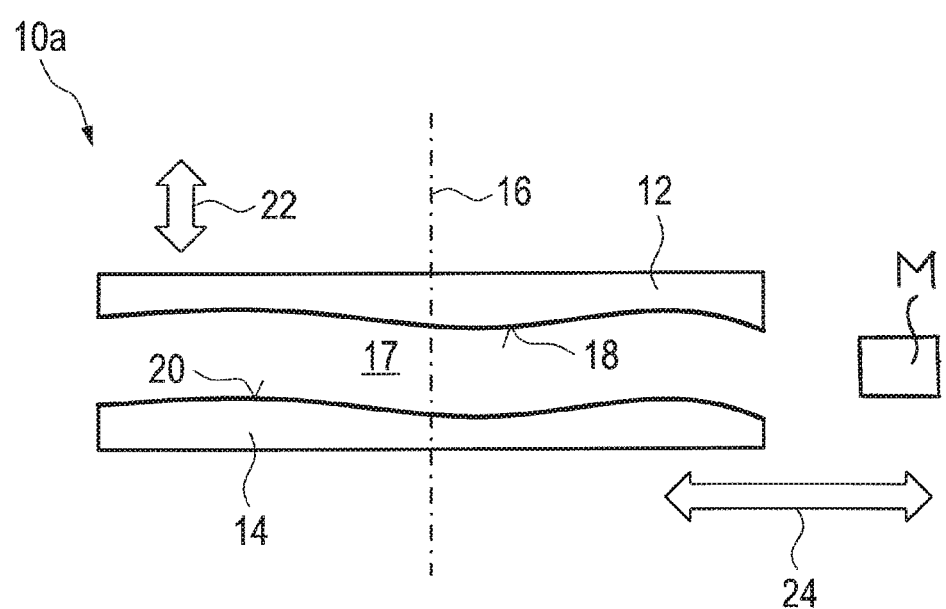
FIG. 1 shows an optical correction arrangement in a schematic side view.

FIG. 1 shows an optical correction arrangement, which is provided in general with the reference sign 10a, in a highly schematic side view that is not true to scale. The optical correction arrangement 10a has a first correction component 12 and a second correction component 14, with the first and the second correction component 12, 14 being arranged in succession along an optical axis 16. The first correction component 12 is arranged at a distance from the second correction component 14 in the direction of the optical axis 16, i.e. in the vertical direction, such that a gap or an interstice 17 is formed between the two correction components 12, 14. The first and the second correction components 12, 14 are each provided with an aspherical surface contour 18, 20 on their inner side facing the interstice 17.

The aspherical surface contours 18, 20 are embodied in such a way that they add at least approximately to zero in a zero position of the optical correction arrangement 10a. Expressed differently, the optical effects of the aspherical surface contours 18, 20 compensate each other in the zero position of the correction arrangement 10a such that, in the zero position of the correction arrangement, the exposure light passes through the optical correction arrangement at least approximately unmodified. In FIG. 1, the aspherical surface contours 18, 20 are each drawn as a wavy contour, with this not limiting the present disclosure.

The first correction component 12 and the second correction component 14 are displaceable with the aid of a manipulator M, the latter being shown schematically here. Preferably, the first correction component 12 is displaceable likewise in both directions parallel to the optical axis 16, as made clear by the double-headed arrow 22. Further preferably, the second correction component 14 is displaceable likewise in both directions perpendicular to the optical axis 16, as made clear by the double-headed arrow 24.

Further, it is possible to displace the first correction component 12 and the second correction component 14 with speeds that differ from one another, with the first correction component 12 being movable more quickly than the second correction component 14. A simultaneous displacement of the two correction components 12, 14 is also possible.

In contrast to the correction arrangements known from the prior art, it is possible to particularly effectively correct optical aberrations occurring during the scanning process thanks to the different displacement speeds of the two correction components 12, 14.

By way of example, it is possible to correct optical aberrations such as overlay errors, which are connected to faulty surfaces or surface roughness of the reticle surface in the object plane and/or of the substrate surface in the image plane, with increased accuracy and reliability. The faulty surfaces are accompanied by a displacement of the object plane or of the image plane, and consequently of the focal position of the projection objective as well. As a result of this, there is a displacement of the focal position of the projection objective, varying quickly in time, during a scanning process for a semiconductor wafer.

This unwanted displacement of the focal position can be compensated by virtue of the surfaces of the reticle surface and/or of the substrate surface being measured prior to the scanning process. The measurement data may be supplied to the manipulator M for controlling the correction components 12, 14. During the scanning process, the manipulator M displaces the first and/or the second correction component 12, 14 in order to bring about relative movement between the two correction components 12, 14. As a result of it being possible to select the displacement speeds of the first and the second correction component to be different from one another, the produced relative movement can be advantageously matched to the measured surface profile of the reticle surface or the substrate surface.

With the aid of the manipulator M, it is possible to set along the optical axis 16 an exemplary base distance of 100 µm between the surface contours 18, 20 with an exemplary accuracy of 1 µm. Proceeding from the base distance set, it is possible to displace the first and/or the second correction component 12, 14 additionally parallel or perpendicular to the optical axis 16.

Figure 2:
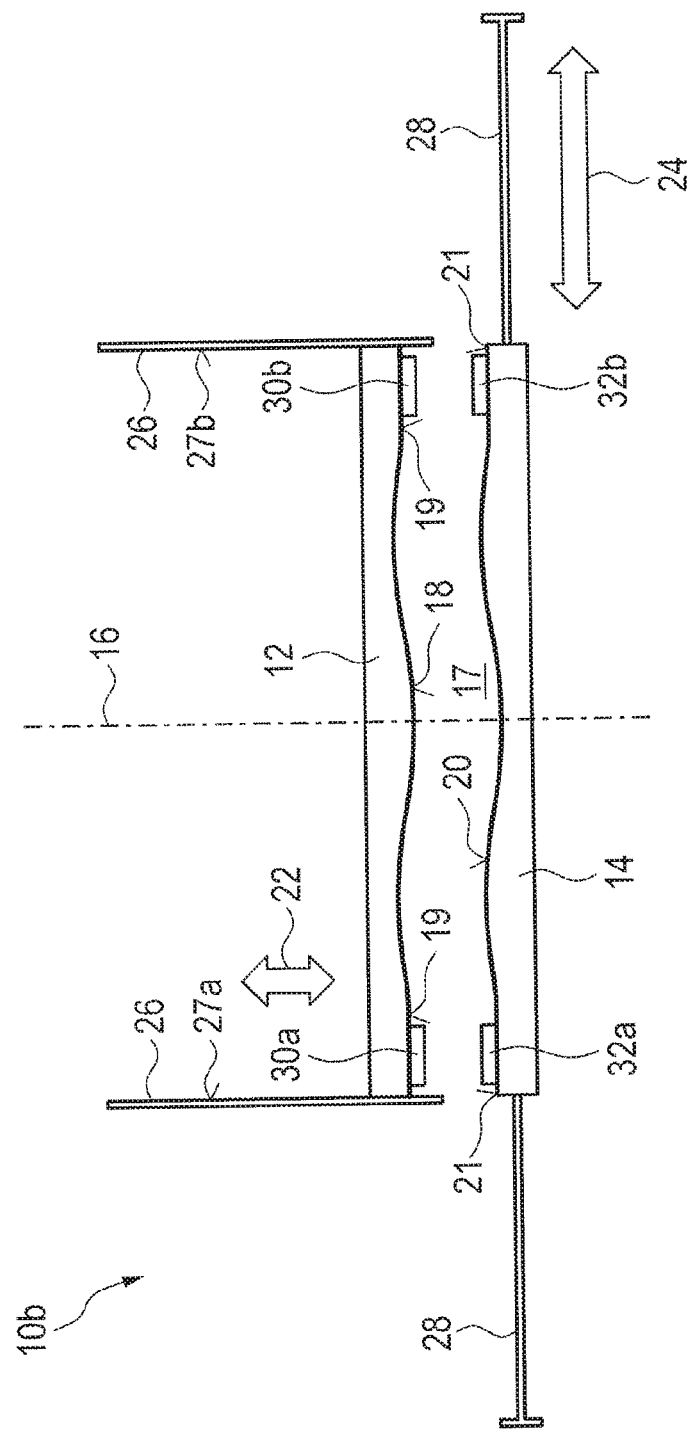
FIG. 2 shows a further optical correction arrangement in a schematic side view, the optical correction arrangement having a magnetic arrangement.

FIG. 2 shows a further optical correction arrangement 10b in a schematic side view. The optical correction arrangement 10b has all features of the optical correction arrangement 10a shown in FIG. 1. In contrast to the optical correction arrangement 10a shown in FIG. 1, the aspherical surface contours 18, 20 do not extend completely over the respective inner side of the first and the second correction component 12, 14. Instead, the aspherical surface contours 18, 20 are restricted to a central region of the optical correction arrangement 10b proceeding from the optical axis 16, and so an edge region 19, 21 of the respective correction component 12, 14 lies exposed without aspherization.

Two permanent magnets 30a, 30b are attached to the edge region 19 of the first correction component 12, with the two permanent magnets 30a, b being spaced apart from one another by way of the aspherical surface contour 18. Two electromagnets 32a, b are attached to the edge region 21 of the second correction component 14, said electromagnets being spaced apart from one another by way of the aspherical surface contour 20. As shown in FIG. 2, the permanent magnets 30a, b and the electromagnets 32a, b are attached on the inner side of the respective correction component 12, 14 facing the interstice 17. The permanent magnets and electromagnets 30a, b, 32a, b consequently form a magnetic arrangement having two magnet pairs: the first magnet pair includes the permanent magnet 30a and the electromagnet 32a; the second magnet pair includes the permanent magnet 30b and the electromagnet 32b.

The first correction component 12 is spaced apart from the second correction component 14 in the vertical direction, with the two correction components being aligned in relation to one another in the direction perpendicular to the optical axis, i.e. in the horizontal direction. In this state, the permanent magnets 30a, b and the electromagnets 32a, b are arranged in such a way that the two magnets of each magnet pair are arranged overlapping in the vertical direction.

Consequently, the magnetic arrangement forms a manipulator for displacing the first and the second correction component 12, 14. Here, a repulsive electromagnetic force action between the permanent magnet 30a, b and the electromagnet 32a, b of the respective magnet pair is used, as will be explained in more detail below.

In the zero position of the optical correction arrangement 10b, the first and the second correction component 12, 14 are preferably brought so closely together in the vertical direction that a small gap between the aspherical surface contours 18, 20 only just still allows the displacement of the second correction component 14 in the horizontal direction 24. This gap (as measured along the optical axis 16) corresponds to the height of the maximum elevation of the aspherical surface contour 18, 20, for example. The zero position can be maintained by repulsive electromagnetic forces, produced by applying an electric voltage to the electromagnets 32a, b, between the two magnets of the respective magnet pair. Here, the electromagnetic forces counteract the weight of at least the first correction component 12 and the permanent magnets 30a, b.

In order to produce a desired corrective effect, the two correction components 12, 14 is desirably displaced or moved relative to one another. To this end, the electric voltage applied to the electromagnets 32a, b is initially increased or reduced in order to displace the first correction component 12 for the purposes of increasing or reducing the vertical distance from the second correction component 16. In order to maintain the set relative position between the correction components 12, 14, the electric voltage may be kept constant following the adjustment process. In this way, the first correction component 12 can also be displaced vertically in a stepwise manner (for instance by applying an electric voltage that increases or decreases in a stepwise manner) or with a comparatively small and fast "stroke". Moreover, the second correction component 14 may be displaced horizontally in a stepwise manner or with a comparatively large and slow "stroke", wherein the displacement per step/stroke is preferably greater than in the first correction component 12.

Moreover, the applied electric voltage can be calibrated with respect to noise and/or production-induced error components. Preferably, the same electric voltage is applied to both magnet pairs such that the force components in the horizontal direction compensate each other in order to avoid an inadvertent horizontal displacement of the second correction component 14.

The electromagnets 32a, b are preferably actuated via a control unit not plotted in FIG. 2, said control unit having a control loop, for example. Consequently, it is advantageously possible to adjust the electric voltage, and consequently the electromagnetic forces, particularly precisely. As a result of this, the displacement of the correction components 12, 14 can be effectuated in a particularly accurate and reliable manner.

It is clear from FIG. 2 that a first guide mechanism 26 is provided for guiding the first correction component 12 in the vertical direction. The first guide mechanism 26 is preferably embodied as a vertical rail for vertical sliding guidance of the first correction component 12 between two sliding faces 27a, 27b facing one another. The sliding faces 27a, b extend in the vertical direction, with the distance between the sliding faces 27a, b substantially corresponding to the width of the first correction component 12. As a result of this, it is advantageously possible to ensure that the first correction component 12 is only movable in the vertical direction. As likewise shown in FIG. 2, the second correction component 14 is displaceable in the horizontal direction along a second guide mechanism 28. The second guide mechanism 28 is preferably configured as a sliding rail extending in the horizontal direction, more preferably as a mechanical tappet.

Figure 3:
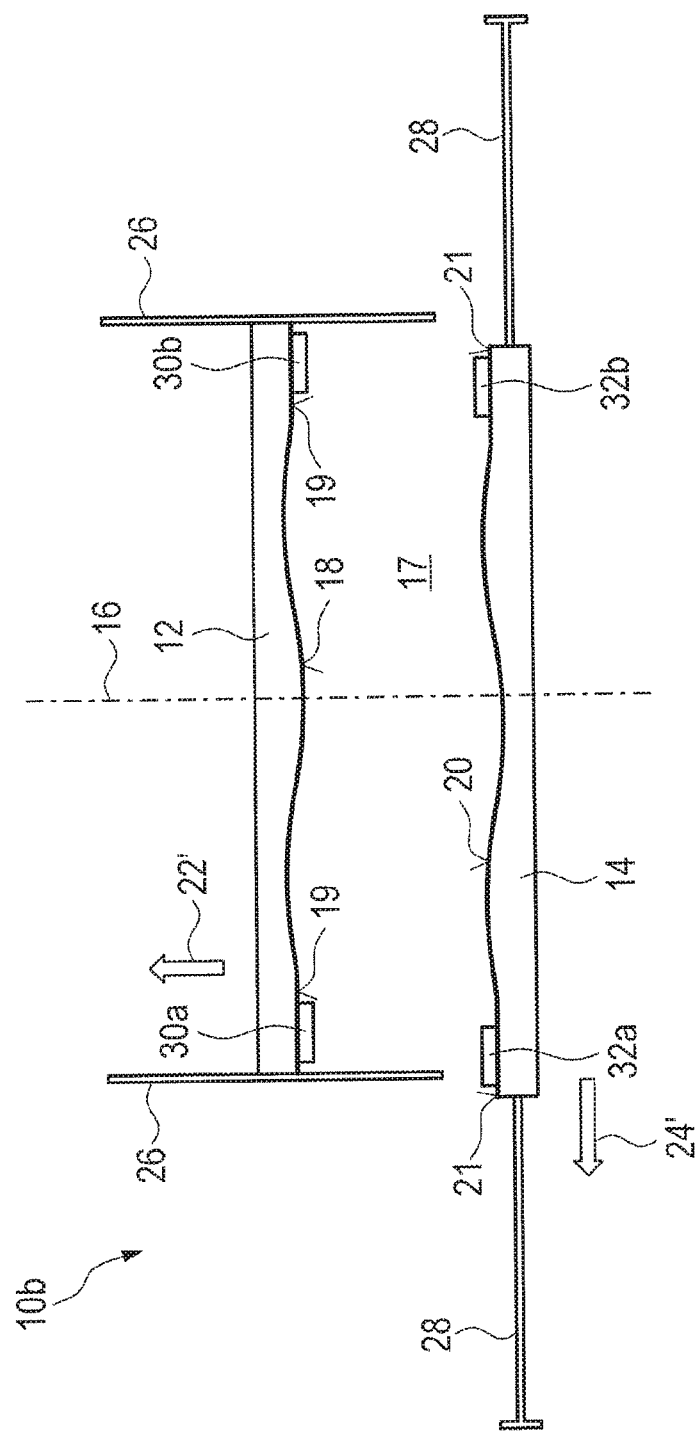
FIG. 3 shows the optical correction arrangement of FIG. 2, with the first correction component being displaced relative to the second correction component in a direction parallel and perpendicular to the optical axis.

FIG. 3 shows the optical correction arrangement 10b of FIG. 2, with the first correction arrangement 12 having, in the vertical direction, a greater distance from the second correction arrangement 14 in comparison with the position shown in FIG. 2; this is elucidated by the arrow 22'.

Further, the second correction component 14 is displaced along the second guide mechanism 28 in the horizontal direction in relation to the first correction component 12; this is elucidated by the arrow 24'. This can be brought about by virtue of a higher electrical voltage being applied to one of the two electromagnets 32a, b (e.g. the electromagnet 32a in this case) than to the other electromagnet (e.g. the electromagnet 32b in this case).

Below, the correction of overlay errors is explained in more detail using the example of the correction arrangement 10b, with the same active principle also applying to the correction arrangements 10a, c from FIGS. 1 and 4.

When exposing a single die of a semiconductor wafer with the aid of a projection objective, exposure light impinges on a reticle. During scanning, the light entry point is displaced in a first horizontal direction, for example in order to pass over the entire width/length of the reticle or a predefined field on the reticle surface. The duration of such a scanning process varies depending on width/length, it typically being able to be 34 milliseconds (ms). Prior to the exposure, there is a preparation phase for adjusting the optical correction arrangement with the aid of the manipulator, with the preparation phase typically taking 54 ms. Consequently, this results in an overall exposure duration of approximately 88 ms per die.

During the scanning process for each die, the focal position of the projection objective may be displaced on account of faulty surfaces of the reticle and/or of the substrate, with the displacement possibly varying greatly over time. In order to counteract this displacement of the focal position, the first correction component 12 is displaced correspondingly quickly in the vertical direction 22, 22' with the aid of the manipulator M. This assumes that the surface profile of the reticle/substrate was measured in advance and supplied to the control unit (not shown here for reasons of clarity) of the manipulator M so that the latter displaces the first correction component 12 in accordance with the measured surface profile. Here, the displacement during the scanning process may be effectuated in a regular or irregular manner, i.e. with a constant or variable speed/acceleration. An additional displacement of the second correction component 14 in the horizontal direction 24, 24' is also conceivable during the scanning process.

In order to scan a plurality of dies on a semiconductor wafer, the aforementioned scanning process is desirably repeated depending on the number of dies, with, before the scanning step ("scan") of each further die, the projection objective being adjusted anew during a preparation step ("step"). In this way, the entire wafer can be exposed via a "step and scan" method.

The subsequent scanning processes for the plurality of dies result in an oscillation movement of the first correction component 12, said oscillation movement being at least approximately periodic. If the aforementioned overall exposure duration of a die of 88 ms is assumed, this results in a frequency of approximately 11.4 Hz, which can be brought about, for example, by applying an AC voltage with the same frequency or a periodically changing voltage with an unchanging sign. Consequently, the vertical displacement of the first correction component 12 relative to the second correction component 14 is advantageously matched to the typical scanning rhythm.

In order to amplify the force action or in order to bring about a faster change in the relative position between the correction components 12, 14, further permanent magnets and/or electromagnets may be attached to the optical correction arrangement 10b. By way of example, the further permanent magnets and/or electromagnets may be applied on the side of the first correction component 12 facing away from the second correction component 14. Alternatively, or additionally, at least one of the correction components 12, 14 may be held via a spring device.

The optical correction arrangement 10b may have a third correction component which is disposed downstream of the second correction component 14 in the direction of the optical axis 16, for example. In this case, the second correction component 14, which is the central correction component of the correction arrangement 10b, may have a stationary arrangement in the vertical direction and/or in the horizontal direction relative to the guide mechanism 26, 28.

Figure 4:
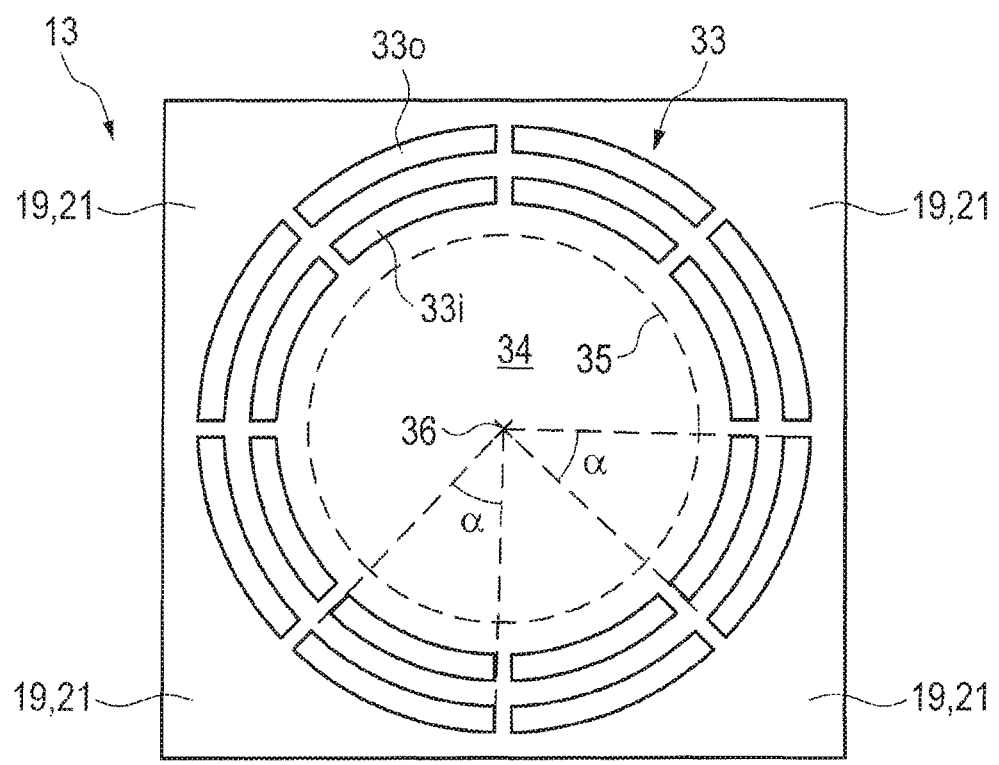
FIG. 4 shows a correction component in a schematic plan view, the correction component having a ring-shaped magnetic arrangement.

FIG. 4 shows a schematic plan view of a correction component 13 with a viewing direction along the optical axis. The correction component 13 may correspond to the first 12 or the second correction component 14 of the optical correction arrangement 10b shown in FIGS. 2-3 and it has a magnetic arrangement 33.

As shown in FIG. 4, the correction component 13 has a square configuration in the horizontal direction. The aspherical surface contours 18, 20 are formed in an optically effective region 34 that is indicated by a dashed circle 35, the center 36 of which lies on the optical axis. The magnetic arrangement 33 is arranged in the edge region 19, 21 of the correction component 13 outside of the optically effective region 34.

As shown in FIG. 4, the magnetic arrangement 33 is further configured in a circular manner around the center 36. The magnetic arrangement 33 has eight arcuate segments, with each segment including an outer magnet 33o and an inner magnet 33i. The outer magnets 33o form an outer circle, with the inner magnets 33i forming an inner circle that is concentric with the outer circle. Here, the segments are distributed so equally that their respective arcuate form includes the same arc angle α.

Figure 5:
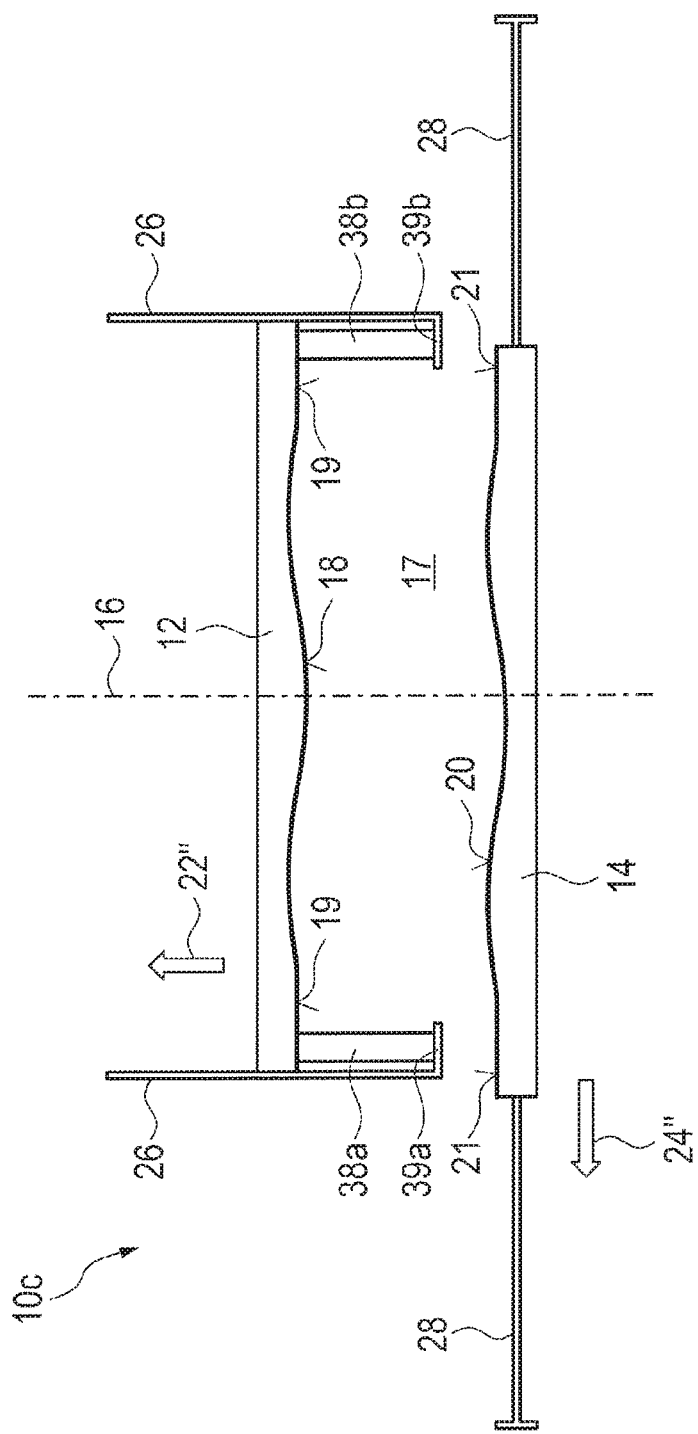
FIG. 5 shows a further optical correction arrangement having an actuator in a schematic side view, with the first correction component being displaced relative to the second correction component in a direction parallel and perpendicular to the optical axis.

Instead of a magnetic arrangement, the manipulator for displacing the first and/or the second correction component may have an actuator. FIG. 5 shows such an actuator 38a, b for vertically displacing the first correction component 12 of a further optical correction arrangement 10c. The actuator 38a, b is arranged in the edge region 19 of the first component 12 and extends from a holder 39a, b to the inner side of the edge region 19 of the first correction component 12. The holder 39a, b is attached to a vertical guide rail and forms the first guide mechanism 26 with the latter.

The actuator 38a, b is preferably fastened to an end on the holder 39a, b, with the vertical extent of the actuator 38a, b being variable. As a result of this, the first correction component 12 can be displaced in the vertical direction. The actuator 38a, b may have an ultrasonic motor, a linear motor, pressure bellows, an actuator based on electroactive polymers and/or an actuator acting on plunger coils.

Figure 6:
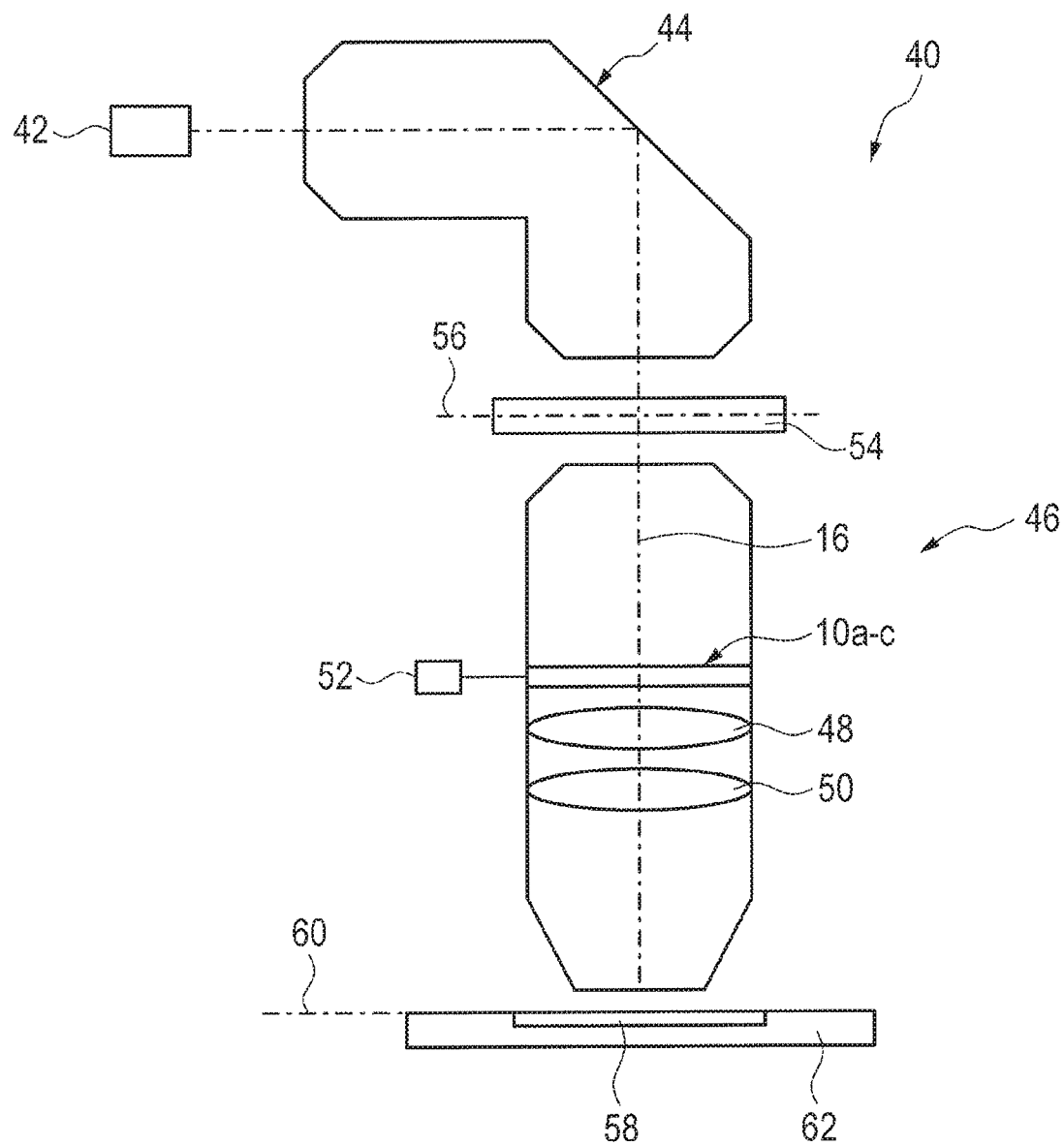
FIG. 6 shows a schematic illustration of a microlithographic apparatus using the example of a projection exposure apparatus, having a projection objective with an optical correction arrangement.

FIG. 6 shows a schematic illustration of a microlithographic apparatus which is embodied as a projection exposure apparatus 40, for example. The projection exposure apparatus 40 has a light source 42 for producing the exposure light, and an illumination optical unit 44 for guiding the exposure light in the direction of a reticle 54 and of a projection objective 46. The reticle 54 contains microstructures or nanostructures which are to be imaged onto the surface of a substrate 58 via the projection objective 46. The microstructures or nanostructures define the object plane 56. The substrate surface defines the image plane 60. Further, the substrate is carried by a wafer stage 62.

The projection objective 46 has an optical correction arrangement, for example one of the above-described optical correction arrangements 10a, b, c, for manipulating the optical wavefront of the exposure light. Further, as shown in FIG. 6, the projection objective 46 has further optical elements along the optical axis 16, in particular lens elements 48, 50.

The correction components of the optical correction arrangement 10a, b, c can be displaced via a manipulator (not shown here for reasons of clarity), with the manipulator being actuated by a control unit 52. By actuating the control unit 52, the various correction components of the optical correction arrangement 10a, b, c may be displaced relative to one another in a vertical and/or horizontal direction. In particular, the correction components may be displaced at different speeds.

With the aid of the correction arrangements 10a, b, c, it is possible to correct optical aberrations, lying in the single-digit nanometer range, in the case of field and/or pupil imaging, in particular field profiles of higher order of individual Zernike polynomials (e.g. Z2 third to fifth order, Z5 first and second order and Z10 first and third order, . . . ), with high accuracy. Such corrections lead to a significant reduction in the overlay error.

What is claimed is:

1. An arrangement, comprising:
   first and second correction components arranged in succession along an optical axis; and
   a manipulator configured to displace the first correction component in a first direction at a first speed and to displace the second correction component in a second direction at a second speed
   wherein:
   the first and the second correction components comprise aspherical surface contours that at least approximately add up to zero overall in a zero position of the arrangement;
   the first speed is at least an order of magnitude greater than the second speed; and
   the manipulator is configured to displace the first correction component according to an oscillation movement along the first direction.

2. The arrangement of claim 1, wherein the oscillation movement is a periodic oscillation movement having a period matched to an exposure duration for a semiconductor chip.

3. The arrangement of claim 2, wherein the period is less than 100 ms.

4. The arrangement of claim 3, wherein the first speed is variable within the period of the oscillation movement.

5. The arrangement of claim 2, wherein the first speed is variable within the period of the oscillation movement.

6. The arrangement of claim 1, wherein the first direction is parallel to the optical axis.

7. The arrangement of claim 6, wherein the second direction is perpendicular to the optical axis.

8. The arrangement of claim 1, wherein the second direction is perpendicular to the optical axis.

9. The arrangement of claim 1, wherein the manipulator is configured to displace the first and second correction components at the same time.

10. The arrangement of claim 1, wherein the manipulator is at least partly arranged in an edge region of the first and/or the second correction component, and the edge region is outside of the aspherical surface contours.

11. The arrangement of claim 1, wherein the manipulator comprises a magnetic arrangement.

12. The arrangement of claim 11, wherein the magnetic arrangement comprises a first magnet at the first correction component and a second magnet at the second correction component.

13. The arrangement of claim 12, wherein the first magnet comprises a permanent magnet, and/or the second magnet comprises an electromagnet.

14. The arrangement of claim 1, wherein the manipulator is configured to interact with a guide mechanism to guide the first correction component and/or the second correction component parallel and/or perpendicular to the optical axis.

15. The arrangement of claim 1, further comprising a third correction component.

16. The arrangement of claim 15, wherein a central correction component of the arrangement in the direction of the optical axis is configured to be stationary relative to the optical axis.

17. The arrangement of claim 1, further comprising a spring device holding the first and/or second correction component.

18. The arrangement of claim 1, wherein the manipulator comprises an actuator.

19. An objective, comprising:
an arrangement according to claim 1,
wherein the objective is a microlithographic projection objective.

20. An apparatus, comprising:
an objective comprising an arrangement according to claim 1,
wherein the apparatus is a projection exposure apparatus.

* * * * *

UNITED STATES PATENT AND TRADEMARK OFFICE
CERTIFICATE OF CORRECTION

PATENT NO. : 10,859,815 B2  
APPLICATION NO. : 15/913418  
DATED : December 8, 2020  
INVENTOR(S) : Holger Walter Page 1 of 1

It is certified that error appears in the above-identified patent and that said Letters Patent is hereby corrected as shown below:

On the Title Page

Column 1 (Assignee), Line 1, after "GmbH" insert -- Oberkochen --;

In the Specification

Column 8, Line 37, delete "l0a" and insert -- 10a --;

Column 8, Line 39, delete "l0a" and insert -- 10a --.

Signed and Sealed this  
Sixteenth Day of February, 2021

Drew Hirshfeld  
*Performing the Functions and Duties of the*  
*Under Secretary of Commerce for Intellectual Property and*  
*Director of the United States Patent and Trademark Office*